United States Patent
Bietsch et al.

(10) Patent No.: US 10,682,824 B2
(45) Date of Patent: Jun. 16, 2020

(54) WAFER-LEVEL MANUFACTURE OF DEVICES, IN PARTICULAR OF OPTICAL DEVICES

(71) Applicant: ams Sensors Singapore Pte. Ltd., Singapore (SG)

(72) Inventors: Alexander Bietsch, Thalwil (CH); Michel Barge, Aeugst-am-Albis (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 392 days.

(21) Appl. No.: 15/310,838

(22) PCT Filed: May 14, 2015

(86) PCT No.: PCT/SG2015/050113
§ 371 (c)(1),
(2) Date: Nov. 14, 2016

(87) PCT Pub. No.: WO2015/174930
PCT Pub. Date: Nov. 19, 2015

(65) Prior Publication Data
US 2017/0087784 A1 Mar. 30, 2017

Related U.S. Application Data

(60) Provisional application No. 61/994,358, filed on May 16, 2014.

(51) Int. Cl.
*B29D 11/00* (2006.01)
*B32B 41/00* (2006.01)
(Continued)

(52) U.S. Cl.
CPC ............ *B29D 11/0074* (2013.01); *B05D 3/12* (2013.01); *B29C 59/02* (2013.01); *B29C 59/16* (2013.01);
(Continued)

(58) Field of Classification Search
CPC ..... B29D 11/0074; B29C 59/02; B29C 59/16; B29C 65/48; B05D 3/12; B32B 41/00;
(Continued)

(56) References Cited

U.S. PATENT DOCUMENTS

2003/0052419 A1 3/2003 Ujiie et al.
2003/0193082 A1 10/2003 Wang et al.
(Continued)

FOREIGN PATENT DOCUMENTS

CN 101617387 A 12/2009
EP 1 837 165 9/2007
(Continued)

OTHER PUBLICATIONS

Intellectual Property Office of Taiwan, Search Report issued in Taiwan Application No. 104115387, dated Jan. 21, 2019, 1 page.
(Continued)

*Primary Examiner* — Mathieu D Vargot
(74) *Attorney, Agent, or Firm* — Michael Best and Friedrich LLP

(57) ABSTRACT

The wafer-level method for applying N≥2 first elements to a first side of a substrate, wherein the substrate has at the first side a first surface including the steps of providing the substrate, wherein at least N barrier members are present at the first side, and wherein each barrier member is associated with one of the first elements. For each of the first elements, the method includes bringing a first amount of a hardenable material in a flowable state in contact with the first surface, the first amount of hardenable material being associated with the first element; controlling a flow of the first amount of hardenable material on the first surface with the associated barrier member; and hardening the first amount of hardenable material to interconnect the first surface and the respective element.

11 Claims, 2 Drawing Sheets

(51) Int. Cl.
*H01L 23/24* (2006.01)
*H01L 21/54* (2006.01)
*B32B 37/12* (2006.01)
*B05D 3/12* (2006.01)
*B29C 59/02* (2006.01)
*B29C 59/16* (2006.01)
*B29C 65/48* (2006.01)
*G02B 13/00* (2006.01)
*G03F 7/20* (2006.01)
*B32B 38/00* (2006.01)
*B29L 31/34* (2006.01)
*B29L 31/00* (2006.01)

(52) U.S. Cl.
CPC .......... *B29C 65/48* (2013.01); *B32B 37/1292* (2013.01); *B32B 41/00* (2013.01); *G02B 13/0085* (2013.01); *G03F 7/2006* (2013.01); *H01L 21/54* (2013.01); *H01L 23/24* (2013.01); *B29L 2031/3475* (2013.01); *B29L 2031/752* (2013.01); *B32B 2038/0076* (2013.01); *B32B 2457/14* (2013.01); *B32B 2457/20* (2013.01); *H01L 2924/0002* (2013.01)

(58) Field of Classification Search
CPC .............. B32B 37/1292; G03F 7/2006; G02B 13/0085
See application file for complete search history.

(56) References Cited

U.S. PATENT DOCUMENTS

| | | |
|---|---|---|
| 2004/0241323 A1 | 12/2004 | Ylitalo et al. |
| 2008/0054506 A1 | 3/2008 | Rudmann et al. |
| 2008/0113160 A1 | 5/2008 | Fernandez et al. |
| 2009/0109355 A1* | 4/2009 | Ishihara .......... B29D 11/00634 349/8 |
| 2009/0213476 A1 | 8/2009 | Takumi et al. |
| 2012/0075709 A1 | 3/2012 | Teramoto et al. |
| 2013/0273238 A1 | 10/2013 | Andrews et al. |

FOREIGN PATENT DOCUMENTS

| | | |
|---|---|---|
| JP | 2006-519711 | 8/2006 |
| JP | 2009-530136 | 8/2009 |
| JP | 2010-052086 | 3/2010 |
| WO | 2009/076786 | 6/2009 |
| WO | WO 2014/042591 | 3/2014 |
| WO | WO 2013/179765 | 1/2016 |
| WO | WO 2014/092148 | 1/2017 |

OTHER PUBLICATIONS

International Search Report and Written Opinion in International Application No. PCT/SG2012/050112, dated Sep. 23, 2015, 13 pages.

International Preliminary Report on Patentability in International Application No. PCT/SG2012/050112, dated Nov. 22, 2016, 8 pages.

* cited by examiner

WAFER-LEVEL MANUFACTURE OF DEVICES, IN PARTICULAR OF OPTICAL DEVICES

BACKGROUND OF THE INVENTION

Field of the Invention

The invention relates to the field of wafer-level manufacturing methods in general, and in particular to the manufacture of devices in which one or more components are attached to a substrate. In a specific view, it relates to the field of micro-optics. In another specific view, it relates to replication methods, in particular to embossing-type processes. The invention relates to methods according to the opening clauses of the claims and to the so-produced devices.

Description of Related Art

Definition of Terms

"Active optical component": A light sensing or a light emitting component. E.g., a photodiode, a photodiode array, an image sensor, an LED, an OLED, a laser chip. An active optical component can be present as a bare die or in a package, i.e. as a packaged component.

"Passive optical component": An optical component redirecting light by refraction and/or diffraction and/or (internal and/or external) reflection such as a lens, a prism, another diffractive or refractive structure, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing (imprinting), casting, molding.

"Wafer": A substantially disk- or plate-like shaped item, its extension in one direction (z-direction or vertical direction or stacking direction) is small with respect to its extension in the other two directions (x- and y-directions or lateral directions). Usually, on a (non-blank) wafer, a plurality of like structures or items are arranged or provided therein, typically on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

From EP 1 837 165 A1, methods for molding optical elements are known in which tools are used that have an overflow volume. Various kinds of such tools are described therein that shall control the flow of replication material.

In WO 2009/076 786, ways of attaching a spacer to a substrate are disclosed.

The invention emerged from the desire to be able to produce optical elements on a substrate under strong space restrictions. Miniaturization and the need to provide more and more functionality per substrate area are important issues in micro-optics as well as in other areas such as microelectronics, micromechanics and microfluidics. In addition, when elements or components, e.g., optical elements, shall be produced in mass production, a high process stability must be reached in order to achieve a suitable yield and thus an efficient manufacturing process.

In particular, it may occur that an element or component, e.g., an optical element such as a lens element, shall be located close to another item such as to another optical element or to a portion of a spacer for keeping two wafers or substrates in a well-defined mutual distance. More particularly, such an element or component may be manufactured using an embossing-type process, in which a replication tool is used for manufacturing the element or component on a substrate. And therein, it is possible to provide that more replication material is used in such an embossing-type process than finally present in the element or component itself. Particularly, it is possible in such an embossing-type process to produce an element or component which comprises the element or component and, in addition, a surrounding portion which is present around the element or component. One reason for providing the additional amount of replication material (excess replication material) and the surrounding portion, respectively, is that a dispensing process in which the replication material is applied between the replication tool and the substrate (typically to one or both of them) has a limited precision. And furthermore, the surrounding portion can make possible to control the flow of the replication material during the embossing process. The provision of excess replication material can contribute to prevent the formation of voids in the element or component.

SUMMARY OF THE INVENTION

Considering the above-described circumstances concerning wafer-level manufacture of optical elements on a substrate using an embossing-type process, the inventors recognized that a flow control of a replication material during an embossing-type manufacture of the optical elements can be achieved by using one or more optical elements already present on the substrate for controlling that flow. In particular, the one or more optical elements already present on the substrate may be optical elements manufactured using an embossing-type replication process, too, and may have a surrounding portion each. And a respective one of these surrounding portions can function as a flow control element or, more particularly as a barrier member, for controlling the flow of a respective one of the other optical elements manufactured in a subsequent step.

However, then the inventors noticed that a barrier member not necessarily needs to be an optical structure present on the substrate before the replication of the other optical elements, but can, more generally, be any structure or structural member being present on the substrate previously. In particular, a barrier member can be or at least comprise some protrusion or ridge present on the substrate. But on the other hand, the inventors realized that it would also be possible to use a depression or trench in the substrate as a barrier member for flow control.

An important goal of the envisaged flow control by means of the barrier member is to prevent an extension of the flowable material into a region on the substrate where it should not be present. E.g., the flowable material should not (or only in admissible parts) cover another item already present on the substrate. This may be the case, e.g., when, prior to the embossing process in question, an optical element is already present on the substrate which comprises an optical element such as a lens element and a surrounding portion (e.g., like mentioned above), and the optical element must remain free of flowable material (replication material) used when creating the other optical element. Or, close to where the optical element is to be positioned on the substrate, a light path is defined in a device including the substrate and the optical element, and that light path shall remain free from the flowable material (replication material) used when creating the other optical element. Or, some areas shall remain free of replication material for mechanical reasons, e.g., in order to allow mechanical contact or approach or attachment of other items to the substrate surface without mechanical interference. Or, some part of the substrate must remain free of replication material for optical reasone, or for cosmetic appearance, or for aesthetic reasons.

And still furthermore, the inventors noticed that using a barrier member for flow control can be useful not only when manufacturing on the substrate an element or component by replication (more particularly by embossing), but whenever an element (which may also be a component) shall be applied to the substrate using a flowable material. For example, such an element can be an optical element, an active optical component, a passive optical component, and it can also be another wafer or parts thereof. And, extending the view beyond the field of optics or micro-optics, the element to be applied to the substrate can be, e.g., a microelectronic component or a microfluidic component such as a fluid guide or pipe or a micro-valve.

And thus, the flowable material used for applying the element to the substrate can be not only a replication material such as a curable epoxy, but can be, e.g., also a bonding material such as a glue (wherein the bonding material or glue may also be a curable epoxy).

Whereas from above-mentioned prior art document EP 1 837 165 A1 it is known to provide some kind of flow control in replication by providing a specific kind of replication tool, the inventors realized that a specific kind of (specifically preconditioned) substrate can allow to achieve the desired flow control. More particularly, the barrier member may be provided, e.g., by a feature of a preshaped substrate or by a member previously applied to the substrate, wherein that member may have the sole function of the barrier member or may have an additional function. In particular, in case the barrier member does not fulfill an additional function, it may be applied to the surface in a replication process, e.g., in an embossing-type process, or in a dispensing process. If the barrier member has one or more functions in addition to controlling the flow, the barrier member may be, e.g., an optical, electro-optical, electronic, mechanic, electromechanic, microfluidic or still another component.

And, furthermore, it may be provided that the element is simultaneously created and applied to the substrate, e.g., like in the case of producing the element by replication, in particular embossing, such as described above. Thus, it can be provided that the element is constituted by the flowable material itself (usually after it is hardened). Or, alternatively, the element may be pre-fabricated and merely be applied to the substrate, e.g., using a bonding agent, e.g., the element being a (pre-fabricated) bulk optical component or an active optical component such as an LED or a photo diode. Accordingly, the element is distinct from the flowable material (also after it is hardened). E.g., in the latter cases, or otherwise when the element shall be electrically connected to the substrate, the flowable material may be a conductive material such as conductive glue, e.g., like used in microelectronics.

The flowable material mentioned above usually is meant to be a hardenable material that can be solidified, in which case it is transformed from the flowable state into a hardened or solidified state, wherein some plastic deformability may possibly remain in that state.

Whereas there is a wealth of materials that can be hardened by extracting energy from the material, in particular by cooling them, the inventors rather envisage to use materials that can be hardened via the introduction of energy. In particular, the envisaged hardenable material may be hardenable by one or both of heating it and irradiating it with electromagnetic radiation, in particular with light, more particularly with UV light. Such materials are known in the art, e.g., in form of epoxy resins or other polymer-based materials, in particular in form of curable polymer-based materials.

After hardening, the element usually will adhere to the substrate due to the hardenable material. And this is usually the case irrespective of the element being composed essentially of the hardenable material (in its hardened state) or the element being distinct from the hardenable material (in its hardened state).

Furthermore, it may be of advantage for various applications to provide that the material of the barrier member (more particularly the material at its surface) is (rather well) wettable by the hardenable material (in its flowable state). This is in contrast to, e.g., solder masks, which are designed to avoid being wetted by the corresponding solder material (in its flowable state). More particularly, for typical applications, materials (for the barrier member and the hardenable material, respectively) are chosen such that a contact angle between the hardenable material and the material of the barrier member (more particularly the material at its surface) is smaller than 90° or rather smaller than 45°, in particular smaller than 30°, more particularly smaller than 22°. In case the barrier member is provided by a feature of a preshaped substrate, the cited contact angles apply for the interface between the hardenable material (in its flowable state) and the surface of the substrate.

In addition, particular cross-sectional shapes of the barrier member may be particularly efficient in controlling the flow of the hardenable material (prior to hardening it) or more specifically for inhibiting a flow of the hardenable material onto a portion of the surface of the substrate which is located (immediately) beyond the barrier member. Such cross-sectional shapes will be described further below.

From microelectronics packaging, a specific method for encapsulating microelectronic components is known as "dam and fill". In a dam-and-fill process, the microelectronic component to be encapsulated is mounted on a substrate (usually in a target position) and only then, a flowable material is applied within a closed-loop dam formed on the substrate around the mounted component: By means of the flowable material (encapsulation material), the component is thus encapsulated. The component is then fully covered (from all sides) by the hardenable material (encapsulation material).

The inventors, however, mainly envisage to not fully cover the respective component by the hardenable material. It is rather envisaged to have at least 60% or rather at least 80% of the area of the component to be applied to the substrate free from the hardenable material, wherein it is referred to an area of a top surface of the respective component visible in a top view onto the substrate, i.e. in a view perpendicularly towards the surface of the substrate onto the respective component. In many cases, even at least 90% or substantially all of the area is free from the hardenable material. These numbers apply in particular in cases of pre-fabricated components to be applied to the substrate.

The inventors, however, furthermore envisage for various applications to have barrier members that do not completely laterally surround the element to be applied to the substrate and in particular not describe a closed-loop shape. For example, in case flow of the hardenable material has to be restricted or inhibited by the barrier member in specific directions only, it can be sufficient, e.g., to provide a barrier member having the shape of a (short) curved or straight line section. However, closed-loop shapes completely laterally surrounding the element to be applied to the substrate may be provided, too, e.g., in case the barrier member is what is described in more detail elsewhere as surrounding portion of an optical structure created by replication (in particular by embossing).

For some applications, it may be of advantage to have a barrier member which completely laterally surrounds the element to be applied to the substrate. This way, items present on the substrate in any (lateral) direction can be protected by the barrier member from being (fully or partially) covered by the hardenable material. Note that the lateral surrounding may be accomplished in a continuous but also in a discontinuous way; the barrier member may, e.g., be composed of several indentations or protrusions which are (mutually) close to each other.

In a specific view onto the invention, the invention concernings using a barrier member present at a first surface of a substrate as a barrier against a flow of a hardenable material (more particularly a replication material) in a flowable state across the barrier member during an embossing-type replication process for producing an element, in particular an optical element, on the first surface, in particular wherein the barrier member is present at the first surface already before the hardenable material is brought into contact with the first surface. Usually, the flow shall be stopped at the barrier member.

One object of the invention is to create an alternative way of applying elements to a substrate using a hardenable material, in particular on wafer level. In particular, the respective method for applying first elements to a first side of a substrate shall be provided. And in addition, a method for manufacturing a device including a substrate section on which a specific first element is present shall be provided. And furthermore, corresponding substrates and devices shall be provided.

Another object of the invention is to create an alternative way of protecting an item present on a substrate from becoming (at least partially) covered by a hardenable material when applying an element to the substrate using the hardenable material.

Another object of the invention is to create a way of achieving a particularly dense population of a wafer with elements applied to the substrate.

Another object of the invention is to create a way of achieving particularly closely spaced elements on a substrate.

Another object of the invention is to create a way of providing elements or structures present on a substrate that have a particularly small footprint.

Another object of the invention is to create a way of providing elements or structures present on a substrate that have a footprint that is specifically tailored, in particular tailored in view of further items or structures present on the substrate.

Another object of the invention is to create a way of achieving one or more of the above objects in wafer-level mass production, and more particularly simultaneously achieving a high efficiency of the manufacturing process.

Another object of the invention is to provide new ways of subsequently providing different or alike elements or structures on a substrate.

Further objects emerge from the description and embodiments below.

Particularly, the invention may include a wafer-level method for applying N≥2 first elements to a first side of a substrate, wherein the substrate has at the first side a first surface. And the method includes:

a) providing the substrate, wherein at least N barrier members are present at the first side, and wherein each of the N barrier members is associated with one of the N first elements;

wherein the method includes for each of the N first elements b) bringing a respective first amount of a hardenable material in a flowable state in contact with the first surface, the respective first amount of hardenable material being associated with the respective first element;

c) controlling a flow of the respective associated first amount of hardenable material on the first surface by means of the respective associated barrier member;

d) hardening the respective associated first amount of hardenable material;

wherein for each of the N first elements, in step d), an interconnection between the first surface and the respective first element is created.

This way, a region of the first surface covered by the hardenable material can be controlled, and in particular, regions of the first surface not to be covered by the hardenable material can be kept from being covered by the hardenable material in a defined way.

The method may also be considered a wafer-level method for manufacturing a device, wherein in the device, N≥2 first elements are applied to a first side of a substrate. And the substrate has at the first side a first surface. And the method includes the above-described steps.

N is a meant to be a positive integer, typically amounting to at least 10 or to at least 30 or even at least 80.

The substrate usually is a wafer.

The substrate usually is solid and/or dimensionally stable.

The substrate can be primarily made of, e.g., a polymer-based material such as a replication material, in particular in case of preshaped substrates. It can be, at least in parts, transparent, in particular in case the first elements are optical elements. For example, the substrate may include at least one non-transparent portion and at least one, typically at least N transparent portions, which are laterally defined portions, wherein furthermore the one or more transparent portions are usually laterally completely surrounded by the at least one non-transparent portion.

The substrate may be made substantially or at least in part of glass.

It can in particular be provided that for each of the N first elements (and associated barrier members and amounts of hardenable material), the steps a), b), c), d) are carried out in the indicated order.

Step b) usually takes place during an instant only (for each first element).

In step b), each of the N first amounts is usually brought in contact with the first surface in a different section of the first surface.

Step b) may take place at different times and thus sequentially for the N first amounts of hardenable material. But it may also take place substantially simultaneously.

The method usually includes for each of the N first elements (and typically starting with the respective step b)) the step of applying the first amount of a hardenable material in a flowable state to the first side, usually in different sections.

During step c) (and usually also during step b)), the respective first amount of hardenable material is present in the flowable state.

Usually, in step c), the hardenable material gets into contact and partially covers the respective barrier member.

Step c) usually takes place in overlapping time intervals for different ones of the first amounts of hardenable material. However, it could also be provided that step c) is carried out consecutively for different ones of the N first elements.

Usually, in step d), a durable (permanent) interconnection between the respective first element and the first surface is created. That interconnection is meant to last until after the first element present on the substrate or on a section of the substrate is incorporated in or becomes part of a device, in particular the device including a housing, the first element then being present inside the housing.

Usually, for each of the N first elements, a vertical extension of the respective first element from the first surface (or from an average level described by the first surface) exceeds a vertical extension of the associated barrier member from the first surface (or from an average level described by the first surface).

Even though it is possible to carry out step d) at different times for different ones of the N first elements, it may be preferred to carry out step d) simultaneously for all N first elements, in particular because of time savings.

Typically, step c) includes, for each of the N first elements, the respective associated at least one barrier member inhibiting a flow of hardenable material (of the respective associated first amount of hardenable material) onto a portion of the first surface located (immediately) beyond said at least one barrier member. Therein, the phrase "portion of the first surface located (immediately) beyond said at least one barrier member" may more specifically refer to or include a section of the first surface located on a line passing through a specific first point and a specific second point. Therein, the first point is a central point of a continuous footprint of the respective first element (in particular, a center of mass of the continuous footprint), and the second point is a central point of a (continuous) footprint of the respective associated barrier member (in particular, a center of mass of the footprint of the barrier member). And the specific second point is located between the specific first point and the section.

Usually, each of the N barrier members is present laterally between a footprint of the associated first element on the first surface and a portion of the surface that shall remain free of the hardenable material. E.g., another element (a second element, e.g., an optical element, a passive optical component, an active optical component) may be present there on the first surface; or a transparent portion of the substrate may be present there, the transparent portion of the substrate constituting a section of an optical path defined in and by a device including the first element and the substrate.

The term "first element" used throughout the present patent application shall not imply that a second element must necessarily exist. But it shall help to distinguish the elements currently referred to from other "elements" mentioned in the present patent application and thus to make the description clearer.

It may be provided that step c) includes the at least one barrier member inhibiting a flow of the hardenable material that would result in the hardenable material completely laterally surrounding the barrier member.

And in particular, it may be provided that for each of the N first elements, the associated at least one barrier member completely laterally surrounds the associated first amount of hardenable material. This may be particularly suitable, in particular in case of space restrictions in many or all directions around the respective first element.

Usually, it is provided that the at least one barrier member is present outside a footprint of the associated first element on the first surface. In other words, the at least one barrier member and its associated first element are free from (lateral) overlap.

In one embodiment, the method refers to applying the N≥2 first elements to the first side of a substrate in a respective target position each, and for each of the N first elements applies that during step b), the respective first element is in a position different from the respective target position; and in step d), the interconnection between the first surface and the respective first element in the respective target position is created.

The target position is meant to be a three-dimensionally defined position (laterally and vertically defined).

This is in contrast to what is done in dam and fill encapsulation processes where firstly, the item to be encapsulated is attached to the substrate (in its target position), and only then, a flowable encapsulation material is applied.

During a subsequent dicing (separating) step possibly taking place, each of the N first elements is (remains) interconnected with the substrate in its respective target position.

In one embodiment, a contact angle for the hardenable material on the barrier member amounts to at most 90°, and in particular to at most 45°, and more particularly to at most 30°. In such cases, a relatively good wetting of the barrier member material takes place, in contrast to, e.g., solder mask processes known from microelectronics printed circuit boards assembly manufacture. In the latter, the material of the solder mask is chosen with the purpose of avoiding a wetting of the solder mask material—in contrast to the present embodiment in which the hardenable material may or even shall partially cover the barrier member.

In one embodiment, energy is applied to the hardenable material in order to harden it or in order to transform it from its flowable to a solidified state. And usually, a hardenable material is chosen that undergoes a chemical reaction in the hardening process, e.g., a curing step. And more particularly, energy must be applied to the hardenable material in order to achieve that it undergoes the chemical reaction.

Whereas in dam and fill processes, usually the complete first element would be covered by the hardenable (encapsulation) material, it is rather envisaged in the invention to avoid this and instead rather to provide that for each of the N first elements, step c) is carried out in such a way that at the end of step d), at least 60%, in particular at least 80% of a top surface area of the respective first element is free from material of the respective first amount of hardenable material. In particular, it may therein be defined that the top surface area is the area of the top surface of the respective first element, with the top surface being constituted by those surfaces of the first element which are visible when viewing ("onto") the first element from a direction perpendicular to the first surface of the substrate.

Each of the at least N barrier members may be or may be provided by
- a replicated structure replicated at the first surface before step b) is carried out, in particular wherein the replicated structure is replicated using an embossing-type process, and more specifically wherein the replicated structure includes an optical element and, in addition, a surrounding portion at least partially surrounding the optical element.

This can be particularly suitable in particular in case the replicated structure shall be present on the substrate anyway. Furthermore, replication is a method particularly suitable for mass production on wafer level.

Each of the at least N barrier members may be or may be provided by
- a surrounding portion of a replicated structure replicated in the first surface before step b) is carried out, the replicated structure comprising, in addition to the surrounding portion, an element, in particular an optical element, the surrounding portion at least partially laterally surrounding the element, in particular wherein the replicated structure is replicated using an embossing-type process.

Also this can be particularly suitable in particular in case said replicated structure shall be present on the substrate anyway. And replication is a method particularly suitable for mass production on wafer level.

And using a surrounding portion as a barrier member can make possible tremendous space savings.

Each of the at least N barrier members may be or may be provided by
- a protrusion protruding beyond an average level described by the first surface.

E.g., ridges, projections, elevations may be provided as barrier members.

Each of the at least N barrier members may be or may be provided by
- a depression in the first side of the substrate extending below an average level described by the first surface.

E.g., trenches, grooves, corrugations or lowerings may be provided as barrier members.

Each of the at least N barrier members may be or may be provided by
- a structure formed on the first surface using a replication method, in particular an embossing-type process.

Each of the at least N barrier members may be or may be provided by
- a structure formed on the first surface using a dispensing method, in particular using a dispenser.

E.g., ridges and other protruding structures may be dispensed on the first surface, so as to provide barrier members.

Each of the at least N barrier members may be or may be provided by
- an item bonded to the first surface, in particular a pre-fabricated item bonded to the first surface, in particular bonded to the first surface using a bonding material.

Each of the at least N barrier members may be or may be provided by
- a structure formed at the first surface by removing material from the substrate, in particular using a laser beam for removing material from the substrate, more particularly laser ablation.

E.g., trenches, grooves and the like may be produced this way.

Each of the at least N barrier members may be or may be provided by
- a structure formed at the first surface using a photolithographic method with an etching step or lift-off step, in particular using a laser lithographic method.

Lithographic methods with an etching step or lift-off step may be used for producing protrusions and/or depressions at the first surface, or even structures including both, a protrusion and a depression. E.g., depressions in the substrate may be produced by selective etching of substrate material; and protrusions on the substrate (more particularly on the first surface) may, e.g., be produced by letting remain photo resist material present at the first surface in pre-defined regions, while removing it from the substrate elsewhere.

Each of the at least N barrier members may be or may be provided by
- a structure formed at the first surface using machining, in particular milling. E.g. a milling machine may be used for selectively removing material from the substrate or of the substrate.

Each of the at least N barrier members may be or may be provided by
- a structure formed at the first surface using a saw, in particularly a dicing saw.

E.g., instead of using the dicing saw for dividing the substrate into separate items, it can also be used for creating trenches or grooves or protrusions in the substrate.

Each of the at least N barrier members may be or may be provided by
- a structural feature at the first substrate being integrally formed with the at least a predominant part of the rest of the substrate, in particular wherein the substrate is manufactured using a replication technique, in particular an embossing-type or molding-typereplication technique.

This way, a suitable substrate may be pre-fabricated. Doing so by using a replication technique can be particularly suitable for mass production.

Each of the N first elements may be or may include one or more of
- a replicated structure replicated at the first surface including steps b), c) and d), in particular wherein the replicated structure is replicated using an embossing-type process, and more specifically wherein the replicated structure includes an optical element and, in addition, a surrounding portion at least partially surrounding the optical element.

This way, usually no additional bonding step needs to be carried out in order to mutually interconnect first elements and substrate.

More particularly, the method may include for each of the N first elements
r) producing the first element at the first surface by means of an embossing-type replication method;
and step r) may furthermore include:
r1) using a replication tool for shaping at least a portion of the first amount of hardenable material;
r2) removing the replication tool from the first amount of hardenable material during or after step h).

Step r) usually is carried out after step b) has taken place.

Each of the first elements may in this case form an integrally formed part including a functional element such as an optical element and, in addition, a surrounding portion laterally surrounding the functional element. Both, the functional element and the surrounding portion of a first element, may this way be produced in one and the same process and from at least substantially the same material.

Also other replicated items mentioned in the present patent application may be manufactured including the steps of using a replication tool for shaping at least a portion of the first amount of hardenable material and of removing the replication tool from the hardenable material during or after hardening.

Each of the N first elements may be or may include an item to be bonded to the first surface, in particular a pre-fabricated item to be bonded to the first surface, in particular bonded to the first surface using a bonding material, e.g., a pre-fabricated bulk optical component.

The hardenable material may thus be said bonding material.

Each of the N first elements may be or may include a micro-optical component, in particular a transparent micro-optical component.

Each of the N first elements may be or may include a passive optical component, in particular a lens element.

Each of the N first elements may be or may include an active optical component.

Each of the N first elements may be or may include an electronic component.

Each of the N first elements may be or may include a light emitting element, in particular an LED, an OLED, a laser diode.

Each of the N first elements may be or may include a light-detecting element, in particular a photo diode or a light detector array, wherein the light detector array may in particular be a two-dimensional light detector array or a one-dimensional light detector array.

Each of the N first elements may be or may include a micro-mechanical component.

Each of the N first elements may be or may include a micro-fluidic component.

Each of the N first elements may be or may include a portion of a wafer, in particular at least one contact standoff of a spacer wafer.

E.g., in the manufacture of devices such as opto-electronic modules, often, spacers are used in order to establish a well-defined vertical distance between wafers (in particular wafers on which optical elements are present). Contact standoffs of such spacers may be positioned particularly close to further items in case a barrier member is used for controlling the flow of the hardenable material (which then more specifically is a bonding material).

In one embodiment, each of the N barrier members includes a protrusion protruding beyond an average level described by the first surface, wherein the respective protrusion includes a first partial surface facing towards the respective first element in its position at the end of step d) or is horizontally aligned within ±30° or rather within ±10°, and a second partial surface facing away from the respective first element in its position at the end of step d). And the first partial surface is, at the end of step d), at least partially (or, rather, to more than 50% by area) covered by hardenable material of the respective associated first amount of hardenable material, and the second partial surface is, at the end of step d), free from hardenable material of the respective associated first amount of hardenable material. And in particular, it may be provided that more than 50% or rather more than 75% of the area of the first partial surface is, at the end of step d), covered by hardenable material of the respective associated first amount of hardenable material.

The second partial surface may be vertically aligned, at least within ±30° or within ±10°.

The first and second partial surfaces are usually adjoining each other.

Furthermore, it may be provided that the first and second partial surface are adjoining at an edge and the first partial surface is, at the end of step d), covered by hardenable material of the respective associated first amount of hardenable material up to the edge. The first partial surface can in this case be fully covered by the hardenable material.

The first and second partial surfaces may, in particular, be at an angle with respect to each other. And the angle usually is at least 230°, rather at least 275° or even at least 290°. In case one or both of the first and second partial surfaces is not planar, a planar mean surface (averaging surface) is taken as reference for determining the angle, wherein, in case an edge is formed between the partial surfaces, a mean surface (averaging surface) close to the edge is taken as reference for determining the angle.

This way, a flow of hardenable material can be stopped particularly effectively, in particular at and because of the edge and/or because of the large angle between the partial surfaces.

In addition, to mutually adjoining first and second partial surfaces, a third partial surface adjoining the first partial surface may be provided at the barrier member. Typically, a first edge is formed where the intermediate partial surface and the first partial surface adjoin, and a second edge is formed where the intermediate partial surface and the second partial surface adjoin. This second edge corresponds to the edge mentioned further above In this case—which may, e.g., be accomplished by providing barrier members by structuring photoresist material—the first partial surface and the third partial surface are usually, at the end of step d), at least partially (usually in full) covered by hardenable material of the respective associated first amount of hardenable material, in particular up to the second edge.

Typical angles between the first and the second partial surfaces have already been described above, cf. there.

And, the first partial surface and the third partial surface may, e.g., be at an angle with respect to each other which is at least 230°, rather at least 260°. In case one or both of the third and the first partial surfaces is not planar, a planar mean surface (averaging surface) is taken as reference for determining the angle.

In one embodiment, each of the N barrier members forms a protrusion protruding beyond an average level described by the first surface by at least 2 μm and/or by at most 150 μm, in particular by between 4 μm and 100 μm.

In another embodiment, each of the N barrier members includes a depression at the first side of the substrate extending below an average level described by the first surface, the respective depression including a first partial surface facing away from the respective first element in its position at the end of step d) and a second partial surface. Furthermore, the first partial surface is, at the end of step d), free from or at most partially covered by hardenable material of the respective associated first amount of hardenable material, and the second partial surface is, at the end of step d), free from hardenable material of the respective associated first amount of hardenable material.

In particular, the first partial surface has a boundary (usuall a boundary to the first surface of the substrate) at which an edge may be present, wherein at the end of step d), material of the first amount of hardenable material extends up to the edge, while the first partial surface is free from hardenable material of the respective associated first amount of hardenable material.

Furthermore, the second partial surface may be facing towards the respective first element in its position at the end of step d) or may be horizontally aligned within ±30°.

Specifically, it may be provided that the first surface and first partial surface are at an angle with respect to each other. And the angle usually is at least 230°, rather at least 275° or even at least 290°. In case the first partial surface is not planar, a planar mean surface (averaging surface) is taken as reference for determining the angle, wherein, in case an edge is formed between the first surface and the first partial surface, a mean surface (averaging surface) close to the edge is taken as reference for determining the angle.

This way, a flow of hardenable material can be stopped particularly effectively, e.g., at the edge and/or because of the large angle between the partial surfaces.

In one embodiment, each of the N barrier members forms a depression in the first side of the substrate extending below an average level described by the first surface by at least 2 µm and/or by at most 150 µm, in particular by between 4 µm and 100 µm.

It is noted that while it may be preferred to provide, as described above, an edge at a respective barrier members, it may on the other hand be preferred to provide that the laterally defined section of the first surface described by a footprint taken (on the first surface) by the respective first element at the end of step d) is smooth and/or free from edges and/or continuously differentiable. This may facilitate a good flow of the hardenable material before step d) starts, which again may result in a good adhesion of the respective first element to the first surface. This may furthermore not only apply to the described laterally defined section of the first surface, but may apply also for that portion of the first surface which is located between said footprint and the respective barrier member (or, more specifically, the footprint of the respective barrier member; or, even more specifically, the laterally defined portion of the first surface described by a footprint taken on the first surface by the respective barrier member).

The described (smooth or continuously differentiable) surface may furthermore be (essentially) flat or planar.

The invention may also include a method for manufacturing a device including a substrate section on which a specific first element is present, wherein the method includes applying, according to one of the methods described herein, N≥2 first elements to a first side of the substrate, wherein the N≥2 first elements include the specific first element, and the substrate includes the substrate section.

This method may furthermore include the step of separating the substrate into parts, one of the parts including the substrate section and the specific first element present on the substrate section. Usually, the separating results in N or more than N separate parts—in particular each of the N parts including:
- one of the N first elements,
- at least a portion of the respective associated first amount of hardenable material; and
- an associated section of the substrate;

wherein the respective first element in the respective target position and the respective associated section of the substrate are interconnected by a respective portion of the respective associated amount of hardenable material.

Furthermore, the device may include one or more further elements or components as well as one or more wafer sections of further one or more wafers.

The device may be, e.g., at least one of
an opto-electronic module;
a camera module; in particular a camera module with a plurality of optical channels, more particularly an array camera module;
a sensor module;
a proximity sensor.

The device may also be, e.g., at least one of
a computing device:
a mobile phone
a smart phone;
a smart watch;
a wireless communication device;
a photographic device;
a vehicle, in particular an automobile;
a personal medical device;
smart glasses;

wherein it may be provided that one or more of the before-mentioned devices is integrated one of these devices.

The invention may furthermore include devices with features described herein for methods according to the invention.

Further embodiments and advantages emerge from the dependent claims and the figures.

BRIEF DESCRIPTION OF THE DRAWINGS

Below, the invention is described in more detail by means of examples and the included drawings. The figures show in a strongly schematized way.

The described embodiments are meant as examples and shall not limit the invention.

The presented figures are all strongly schematized.

DETAILED DESCRIPTION OF THE INVENTION

Figure 1:
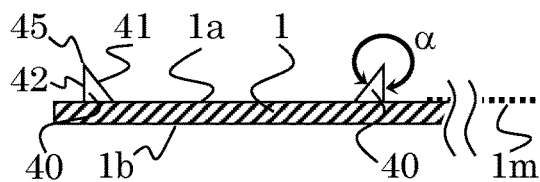
FIG. 1 a substrate with barrier members, in a cross-sectional view.

FIG. 1 shows, in a cross-sectional view, a substrate 1 having at a first side a first surface 1a and at a second side a second surface 1b. Substrate 1 is a wafer, and only a small portion of the wafer is visible in FIG. 1.

Figure 13:
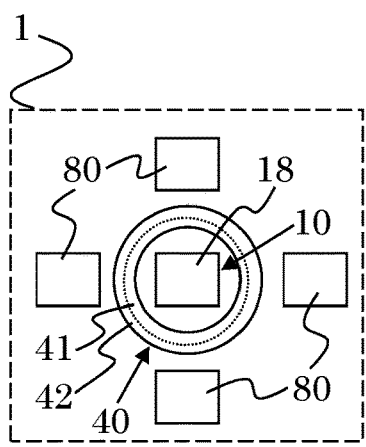
FIG. 13 an element and an associated barrier member as as well as further items on a substrate, in a top view.

At surface 1a, a barrier member 40 is present, which may describe a closed-loop shape such as a circle or a rectangle. In FIG. 13, a barrier member 40 describing a circular closed loop is illustrated in a top view.

Substrate 1 defines lateral directions, which are directions parallel to the first and second sides of substrate 1 and, accordingly, also vertical directions, which are perpendicular to the lateral directions. An average level of first surface 1a is referred to as 1m.

Barrier member 40 has a first partial surface 41 and a second partial surface 42 which are at an angle α amounting, in the example of FIG. 1 to about 320°. Partial surfaces 41, 42 may, as illustrated in FIG. 1 adjoin at an edge 45.

In particular, second partial surface 42 may, in general for protruding barrier members 40, be vertically aligned, at least within ±35° or rather within ±15°.

Furthermore, barrier member 40 may, in general for protruding barrier members 40, protrude beyond an average level described by the first surface by at least 2 μm or by at least 8 μm, and/or by at most 150 μm or by at most 80 μm.

Figure 2:
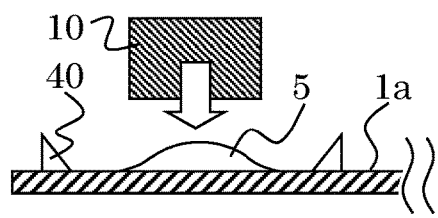
FIG. 2 the substrate of FIG. 1 during the process of applying an element to the substrate, in a cross-sectional view.

FIG. 2 illustrates substrate 1 of FIG. 1 in the same cross-sectional view, but during the process of applying an element 10 to substrate 1. A hardenable material 5 in a flowable state (typically a liquid hardenable material 5) has been brought into contact with surface 1a, such that on surface 1a, an amount of the material 5 is present. Hardenable material 5 may be, e.g., a heat-curable and/or a UV-curable adhesive, e.g., a heat-curable and/or a UV-curable epoxy resin. With barrier member 40 present on substrate 1, element 10 is brought into contact with material 5, as illustrated by the open arrow in FIG. 2.

Figure 3:
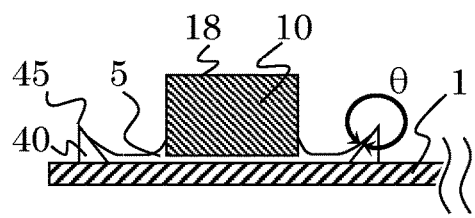
FIG. 3 the substrate of FIGS. 1 and 2 with the element attached in its target position, in a cross-sectional view.

In FIG. 3, the substrate of FIGS. 1 and 2 is illustrated with element 10 attached to substrate 1 in its target position. Material 5 is hardened, such that element 10 is permanently fixed to substrate 1. The presence of barrier member 40 effects that a flow of material 5 (prior to the hardening) is controlled. In particular, material 5 shall not flow across barrier member 40. This way, features or elements or any kind of items present beyond barrier member 40 are not exposed to and/or (partially) covered by some of the material 5. Accordingly, using barrier members can make possible to achieve a particularly high density of elements on a substrate.

It is noted that partial surface 41 of barrier member 40 is at least partially covered by material 5. In contrast to other concepts such as, e.g., solder masks, this is a desired effect, and, accordingly, a contact angle θ between the material of barrier member 40 and hardenable material 5 is rather low, e.g., θ=14° as illustrated in the example of FIG. 3.

Furthermore, it is usually not intended to encapsulate the element, as can also be seen from the fact that a top surface 18 of element 10 is completely free from material 5.

It is noted that the region of surface 1a where element 10 is present at surface 1a (with some of material 5 in between, of course) is smooth, free of edges, and in addition, it is also planar, essentially flat.

Element 10 may be virtually any kind of item to be attached to substrate 1, in particular a pre-fabricated item, e.g., an active optical component or a passive optical component, or an electronics component.

Figure 4:
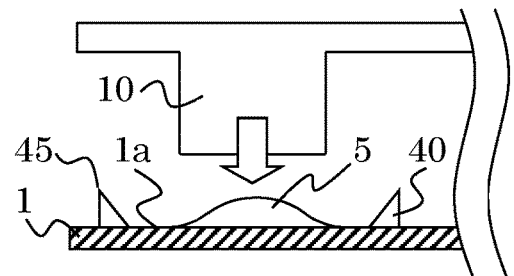
FIG. 4 the substrate of FIG. 1 during the process of applying an element which is a wafer, in a cross-sectional view.
Figure 5:
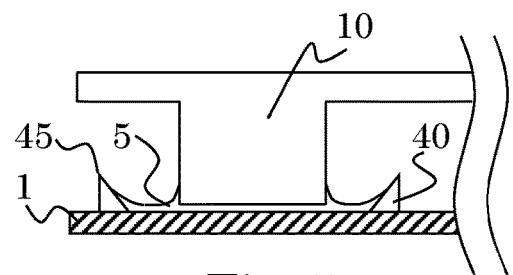
FIG. 5 the substrate of FIGS. 1 and 4 with the wafer attached in its target position, in a cross-sectional view.

FIGS. 4 and 5 illustrate, similarly to FIGS. 2 and 3, respectively, the case that element 10 is a part of an extended substrate such as of a waferscale substrate, wherein on the waferscale substrate, elements may possibly be provided (pre-assembled elements). Element 10 may be a wafer or a portion of a wafer. Again, element 10 is in its target position (cf. FIG. 5) not before material 5 is applied to surface 1a.

Figure 6:
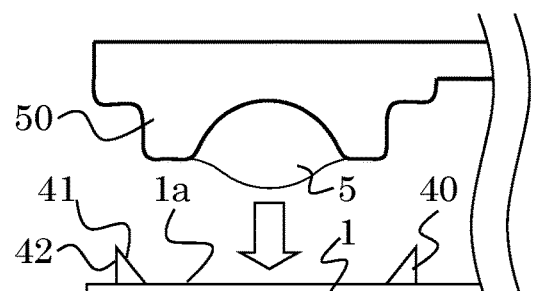
FIG. 6 the substrate of FIG. 1 during the process of applying an element which is a replicated optical element, in a cross-sectional view.

However, the application of an element 10 to substrate 1 may also be accomplished in such a way that the element 10 is simultaneously (in one and the same process) created and applied (or attached) to surface 1a, e.g., as shown in FIG. 6.

FIG. 6 shows again the substrate of FIG. 1 during the process of applying an element 10, but element 10 includes a replicated optical element to be created on surface 1a in an embossing-type process. A replication tool 50 is provided that determines at least in part the shape of element 10. Hardenable material 5 is more specifically a replication material, e.g., a curable epoxy resin. Material 5 is applied between replication tool 50 and substrate 1, e.g., as illustrated in FIG. 6, applied to replication tool 50. Then, replication tool 50 is brought close to or even in contact with surface 1a, as illustrated by the open arrow.

With replication tool 50 in place, hardening of material 5 is started or even completed. In particular, when optical element 10 is a transparent optical element such as a lens, material 5 is an optically transparent material, and, as illustrated in FIG. 6, substrate 1 may also be transparent, at least in part. Transparency may of course possibly refer to only a portion of the electromagnetic spectrum such as to infrared light only.

Whereas hardenable material 5 is a replication material constituting element 10 in the example of FIG. 6, it is merely an adhesive or bonding material in the examples of FIGS. 2, 3 and 4, 5.

Figure 7:
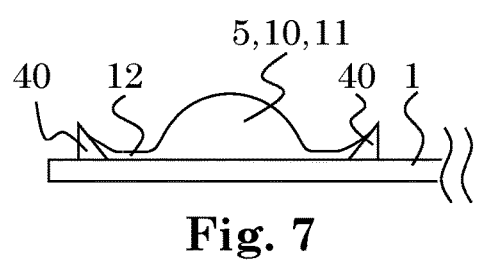
FIG. 7 the substrate of FIG. 6 with the optical element present on the substrate in its target position, in a cross-sectional view.

FIG. 7 shows substrate 1 of FIG. 6 with replication tool 50 removed and material 5 completely hardened. The element 10 is now created and present on (and solidly interconnected to) substrate 1 in its target position.

In an embossing-type replication process, elements may be produced which include, as illustrated in FIG. 7, a main portion 11 constituting a functional element such as a lens element and, in addition, a surrounding portion 12, which completely (or at least in part) laterally surrounds the main portion 11. Main portion 11 and surrounding portion 12 are produced in one and the same process and of the same material. They constitute an integrally formed part (namely element 10). Usually, the surrounding portion 12 does not have a specific function, e.g., no optical function, but merely is a result of the way of manufacturing the main portion 11.

However, such a surrounding portion may be used as a barrier member, as will be described referring to FIG. 8.

Figure 8:
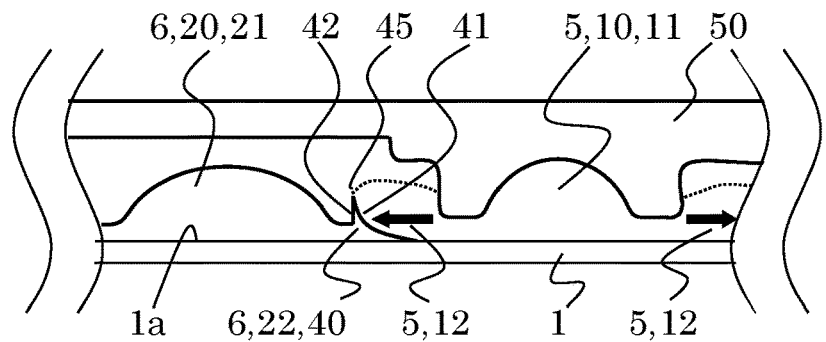
FIG. 8 an illustration of an application of an element onto a substrate by replicating the element on the substrate, wherein a barrier member is provided by another element replicated on the substrate, in a cross-sectional view.

FIG. 8 is a cross-sectional illustration of an application of an element 10 onto a substrate 1 by replicating the element 10 on substrate 1, wherein a barrier member 40 is provided by another element 20 previously replicated on the substrate 1.

Accordingly, initially, an element 20 has been produced on substrate 1 using an embossing-type process using a replication tool (not shown) and a flowable and/or liquid hardenable (replication) material 6. That element 20 includes a main portion 21 and a surrounding portion 22. Surrounding portion 22 provides two partial surfaces 41, 42, which are at a large angle with each other and form an edge 45. The particular shape of surrounding portion 22 basically originates from a suitable design of the replication tool, which may, e.g., correspond to the design of the replication tool 50 of FIG. 6. Partial surface 42 is a replication of a surface of the replication tool, whereas partial surface 42 has a meniscus shape, which is determined by the amount of material 6 used in the replication process and by material properties, more particularly by the contact angle between material 6 and the material of the replication tool and also by the contact angle between material 6 and the material at surface 1a.

Element 20, more particularly surrounding portion 22 and still more particularly partial surfaces 41, 42 (and edge 45) may, for a subsequent process, function as a barrier member 40.

That subsequent process may be, e.g., again a replication process and more particularly an embossing process, as illustrated in FIG. 8. FIG. 8 illustrates the situation at the beginning of a hardening process for a (replication) material 5 applied to surface 1a that is formed by a replication tool 50. Material 5 (cf. the dotted lines in FIG. 8) is forced to flow as indicated by the black arrows. Its flow is controlled and stopped by barrier member 40 provided by surrounding portion 22 of the structure present on substrate 1 already in advance (cf. above). Material 5 constitutes a main portion 11 and a surrounding portion 12.

After hardening (in particular curing) material 5, two elements 10, 20 are present on substrate 1 that include, e.g., a lens element each and that are very close to each other. Their respective surrounding portions 12, 22 are (laterally) overlaping.

Figure 9:
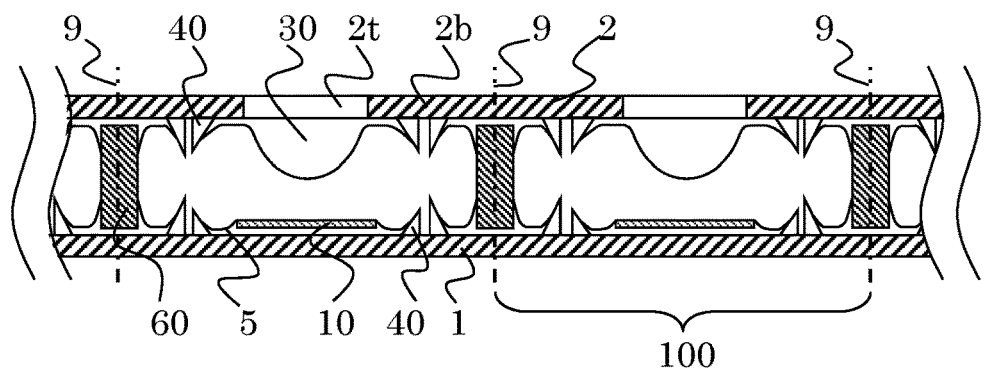
FIG. 9 an illustration of wafer-level manufactured devices which are opto-electronic modules, in a cross-sectional view.

FIG. 9 is an illustration of wafer-level manufactured devices, which are opto-electronic modules 100, in a cross-sectional view before dicing. In the illustrated case, various elements have been applied to different substrates using barrier members for flow control. More particularly, on a substrate 1, a hardenable material 5 (bonding material) has been used for connecting elements 10 such as image sensors to a substrate 1, and for connecting elements 30 such as replicated lens elements to a substrate 2, and for interconnecting substrates 1 and 2 via a spacer wafer representing an element 60.

The application of the respective elements may be accomplished, e.g., in one of the above-described ways. Substrate 2 includes a non-transparent portion 2b through which light cannot pass and transparent portions 2t through which light can pass.

After separation of the wafer stack illustrated in FIG. 9 into a plurality of individual opto-electronic modules 100, the latter can be incoporated in a device such as a smart phone or a photographic device or another light sensing device or illumination device or still other optical device. Separation lines (dicing tracks) are referenced 9 in FIG. 9.

Figure 10:
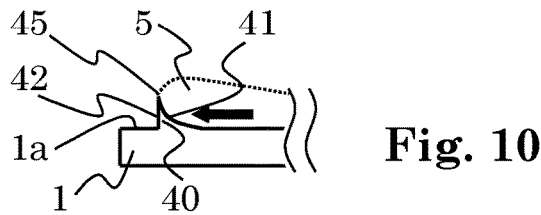
FIG. 10 an illustration of a flow of material onto a barrier member integrated in a substrate, in a cross-sectional view.

FIG. 10 is a cross-sectional illustration of a flow of material onto a barrier member 40 integrated in a substrate 1. Barrier member 40 has a shape similar to the one illustrated in FIG. 8 for the barrier member constituted by a surrounding portion of a replicated structure, having a concavely curved first partial surface 41. However, as illustrated in FIG. 10, it is also possible to provide a pre-shaped substrate 1 that incorporates barrier members. In particular, it is possible to produce such pre-shaped substrates by means of replication techniques, e.g., by molding or embossing.

The dotted line in FIG. 10 symbolizes the surface of the hardenable material 5. The dark arrow indicates the direction of flow of material 5. As can be seen in FIG. 10, partial surface 41 is covered by material 5. And edge 45 (particularly in combination with a steep, e.g., as illustrated, vertical surface 42) is a particularly strong barrier to the flow of material 5. Considerable amounts of material 5 may be present, while material 5 is still precluded from wetting partial surface 42 and from flowing across and beyond barrier member 40. Thus, the flow of material 5 is controlled by barrier member 40, and material can be hardened, in particular in the state illustrated in FIG. 10.

Figure 11:
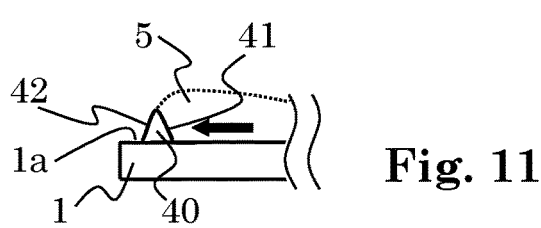
FIG. 11 an illustration of a flow of material onto a barrier member dispensed onto a substrate, in a cross-sectional view.

FIG. 11 is an illustration of a flow of a hardenable material 5 onto a barrier member 40 dispensed onto a substrate 1. The illustration is similar to the one of FIG. 10, however in this case, the substrate 1 is not pre-shaped (but is simply planar), and barrier member 40 has been added after manufacture of the (planar) substrate 1. A dispenser can be used for depositing material 5 on substrate 1, e.g., a dispenser like used for underfilling processes in electronics packaging.

In the illustrated case of FIG. 11, there is no edge or at least no pronounced edge present between the partial surfaces 41, 42 of barrier member 40. However, their mutual angle makes is difficult for material 5 to flow across the highest point.

Figure 16:
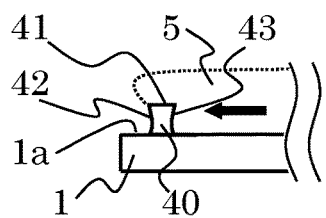
FIG. 16 an illustration of a flow of material onto a barrier member such as a barrier member formed by photo resist material, in a cross-sectional view.

FIG. 16 is another cross-sectional illustration of a flow of material onto a barrier member 40, wherein the barrier member 40 is a structure protruding from substrate 1, more particularly the barrier member is provided by structured photoresist material. Otherwise, the illustration is similar to the one of FIG. 10. Barrier member 40 has a first partial surface 41, a second partial surface 42, and a third partial surface 43. Partial surface 41 is interconnecting partial surfaces 42 and 43.

In one way to obtain such barrier members, a photoresist material is applied (on the first side of substrate 1), e.g., by spinning. This way, a photoresist film may be created. The film may cover one continuous region. Then, the photoresist material is structured, in particularly photolithographically structured, by locally illuminating it, e.g., with UV light, and subsequently removing the illuminated or the not illuminated part of the photoresist material. At least part of the remaining photoresist material then provides barrier members 40. Photoresist barrier members 40 may show an undercut, as illustrated in FIG. 16. This way, a more efficient flow stopping at the edge between first partial surface 41 and second partial surface 42 is achieved. However, it is also possible that other flanks (not undercut flanks), e.g., straight flanks, are provided.

In case of photoresist barrier members, the first partial surface 41 is usually horizontally aligned. Even though the flow of hardenable material 5 may stop already at the edge between third partial surface 43 and first partial surface 41, flow stopping is more effectively accomplished at the edge between intermediate partial surface 41 and second partial surface 42. Thus, usually, finally, third partial surface 43 and first partial surface 41 are both covered by hardenable material 5, while second partial surface 42 is free from hardenable material 5.

Figure 12:
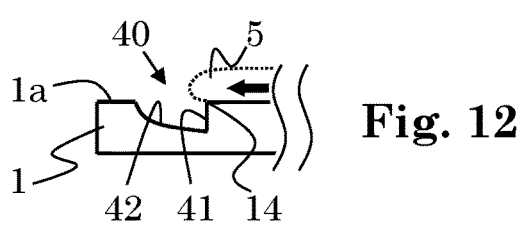
FIG. 12 an illustration of a flow of material towards a barrier member which is a depression in a substrate, in a cross-sectional view.

FIG. 12 is yet another illustration similar to the ones of FIGS. 10, 11 and 16, but it is an illustration of a flow of material 5 towards a barrier member 40 which is a depression in a substrate 1. This substrate 1 may be either a pre-fabricated one in the sense that its shape (including the barrier members) is determined by its manufacture (e.g., by replication), in particular without additional steps for producing barrier members 40, or may be a substrate 1 obtained by manufacturing an initial substrate such as a planar substrate (cf. also FIG. 11), and then, material of the substrate is selectively removed in order to form barrier members 40. The subsequent removal of material may be accomplished, e.g., by using laser ablation, using selective etching (e.g., in lithographic methods), or by using a dicing saw.

It can be advantageous for the flow control to provide an edge 14 at that end of barrier 40, which is closest to the target position of the element to be applied to the substrate 1, i.e. at that end of barrier 40 that is closest the origin of flow of material 5. The edge 14 may, in general for depressions, be present where the first partial surface adjoins the first surface of substrate 1. However, also there, it is possible have a rounded transition instead of an edge 14, similar to the case of FIG. 11 versus FIG. 10.

Having a particularly large angle between partial surface 41 and surface 1*a* (where it adjoins partial surface 41) can improve the flow control or flow-stop properties of barrier member 40. In the example of FIG. 12, the angle is 270°.

In case of a depression, such as illustrated in FIG. 12, it applies that in general, the first partial surface 41 may be vertically aligned, at least within ±35° or rather within ±15°.

Furthermore, a barrier member may, in general for recessed barrier members (depressions), extend below an average level described by the first surface by at least 2 μm or by at least 8 μm, and/or by at most 150 μm or by at most 80 μm;

FIG. 13 illustrates a top view of an element 10 and an associated barrier 40 member on a substrate 1. As already mentioned in conjunction with FIG. 1, barrier member 40 may describe a loop completely laterally circumscribing element 10. This way, it can be prevented that any of the items 80 present on substrate 1 would be wetted or covered by material 5. And/or it can be prevented that place intended to be taken by items 80 would be covered or wetted by material 5. This might be useful, e.g., in case items 80 cannot be properly connected to substrate 1 if some of material is present in the intended location on substrate 1. The outer lateral boundary of material 5 is illustrated by the dotted line in FIG. 13.

Figure 14:
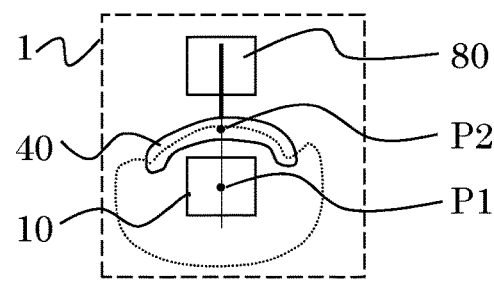
FIG. 14 an element and an associated barrier member as as well as a further item on a substrate, in a top view.

FIG. 14 is a similar illustration as FIG. 13. However, the barrier member 40 does not describe a closed-loop shape. An item 80 is located at substrate 1 in such a way that barrier member 40 is arranged laterally between it and the element 10 when applied to substrate 1. A thick solid straight line section illustrates points at the surface of substrate 1 that are prevented from being covered by material 5 by barrier member 40. An extension of the line passes through two points P1, P2, wherein P1 is a central point of element 10 in the surface, more particularly a center of mass of the footprint of element 10 at the surface. And point P2 designates a central point of barrier member 40 at the surface, more particularly a center of mass of the footprint of barrier member 40 at the surface.

Figure 15:
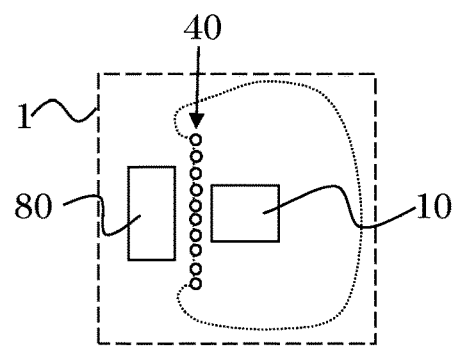
FIG. 15 an element and an associated discontinuous barrier member as as well as a further item on a substrate, in a top view.

FIG. 15 is a similar illustration as FIGS. 13 and 14. In FIG. 15, it is illustrated that a barrier member can also be discontinuous. Alternatively, FIG. 15 can also be interpreted to show several barrier members associated with element 10, and these barrier members protect item 80 from material 5.

As has been described above, it is usually provided that an element 10 is in its target position not before the material 5 gets into contact with the surface 1*a* of the substrate 1. Accordingly, the element is mounted on the surface 1*a* not before the material 5 gets into contact with the surface 1*a*. A process of mounting the element 10 on the substrate 1 is usually finished only after the hardenable material 5 is hardened (solidified).

In a lateral area where a barrier member is present at the substrate 1, the substrate 1 usually is thicker or thinner than its avergage thickness of substrate.

As will have become clear from the above, it is usually provided that a boundary of a footprint of an element 10 in the target position on surface 1*a* is (laterally) at a distance from the associated barrier member 40. And in particular, after the hardening of the material 5, the surface 1*a* is (typically completely) covered by the hardenable material 5 along said distance.

It is noted that various possibilities are described in the present patent application as to how elements and items present at the substrate may be embodied.

A high density of (functional) elements on a substrate in wafer level manufacture can be achieved by means of the described methods. And specific ones of the elements can be positioned very close to each other, in particular without undesired overlap of material.

It is noted that contact angles described in the present patent application are, more precisely, "advancing contact angles" rather than "receding contact angles", as is also clear from the described process.

The invention claimed is:

1. A wafer-level method for applying N≥2 first elements to a first side of a substrate, the substrate providing at the first side a first surface, the method comprising:
   a) replicating at least N barrier members and an initial first element on the first surface of the substrate by an embossing-type or molding-type process, wherein the initial element and at least one of the at least N barrier members are simultaneously and integrally formed, and wherein each of the N barrier members is associated with one of the N first elements;
   b) bringing a respective first amount of a hardenable material in a flowable state in contact with the first surface, the respective first amount of hardenable material being subsequently used to form a respective one of the N first elements;
   c) performing an embossing-type replication technique that includes pressing a replication tool into the first amount of the hardenable material;
   d) controlling a flow of the respective associated first amount of hardenable material on the first surface, during the embossing-type replication technique, by means of a respective barrier member integrally formed with the initial first element;
   e) hardening the respective associated first amount of hardenable material to form the respective one of the N first elements.

2. The method according to claim 1, wherein a contact angle for the hardenable material on the barrier member amounts to at most 90°.

3. The method according to claim 1, wherein the hardenable material is hardenable via the introduction of energy.

4. The method according to claim 1, wherein each of the N first elements is or comprises one or more of
   a replicated structure replicated at the first surface comprising steps b), c) and d);
   an item to be bonded to the first surface;
   a micro-optical component;
   a passive optical component;
   an active optical component;

an electronic component;
a light emitting element;
a light-detecting element;
a micro-mechanical component;
a micro-fluidic component;
a portion of a wafer.

5. The method according to claim 1, wherein each of the N barrier members comprises a protrusion protruding beyond an average level described by the first surface,
  the respective protrusion comprising a first partial surface, said first partial surface is at least one of:
    facing towards the respective first element in its position at the end of step d) and being horizontally aligned within ±35°,
    and a second partial surface facing away from the respective first element in its position at the end of step d),
  wherein the first partial surface is, at the end of step d), at least partially covered by hardenable material of the respective associated first amount of hardenable material, and
  wherein the second partial surface is, at the end of step d), free from hardenable material of the respective associated first amount of hardenable material.

6. The method according to claim 1, wherein each of the N barrier members forms a protrusion protruding beyond an average level described by the first surface by at least 2 μm or by at most 150 μm or by both, at least 2 μm and at most 150 μm.

7. The method according to claim 1, wherein a contact angle for the hardenable material on the barrier member amounts to at most 45°.

8. The method according to claim 1, wherein the hardenable material is hardenable by one or both of heating it and irradiating it with electromagnetic radiation.

9. The method according to claim 1, wherein each of the N first elements is an optical element.

10. The method according to claim 5, wherein the first and second partial surface are adjoining at an edge and the first partial surface is, at the end of step e), covered by hardenable material of the respective associated first amount of hardenable material up to the edge.

11. The method of claim 1 including hardening the respective associated first amount of hardenable material to form the respective one of the first elements surrounded laterally by the associated one of the barrier members.

* * * * *